(12) United States Patent
Kwon et al.

(10) Patent No.: US 11,467,704 B2
(45) Date of Patent: Oct. 11, 2022

(54) TOUCH SENSOR AND IMAGE DISPLAY DEVICE INCLUDING THE SAME

(71) Applicant: DONGWOO FINE-CHEM CO., LTD., Jeollabuk-do (KR)

(72) Inventors: Do Hyoung Kwon, Gyeonggi-do (KR); Ji Yeon Kim, Gyeonggi-do (KR); Ki Deok Lee, Gyeonggi-do (KR); Cheol Hun Lee, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 17/128,413

(22) Filed: Dec. 21, 2020

(65) Prior Publication Data
US 2021/0191576 A1 Jun. 24, 2021

(30) Foreign Application Priority Data

Dec. 24, 2019 (KR) .......................... 10-2019-0173848

(51) Int. Cl.
  *G06F 3/044* (2006.01)
  *G02F 1/1333* (2006.01)
  *H01L 51/52* (2006.01)
  *G02B 5/30* (2006.01)
  *H01L 27/32* (2006.01)

(52) U.S. Cl.
  CPC .......... *G06F 3/0448* (2019.05); *G06F 3/0443* (2019.05); *G02B 5/3016* (2013.01); *G02F 1/13338* (2013.01); *H01L 27/323* (2013.01); *H01L 51/5281* (2013.01)

(58) Field of Classification Search
None
See application file for complete search history.

(56) References Cited

U.S. PATENT DOCUMENTS

| 2009/0315854 | A1* | 12/2009 | Matsuo | G06F 3/0443 345/174 |
| 2011/0090154 | A1* | 4/2011 | Kuo | G06F 3/0446 345/173 |
| 2014/0098057 | A1* | 4/2014 | Lee | G06F 3/0446 345/174 |
| 2017/0139525 | A1* | 5/2017 | Jo | G06F 3/0448 |
| 2017/0344162 | A1* | 11/2017 | Lee | G06F 3/0412 |
| 2018/0120977 | A1* | 5/2018 | Shim | G06F 3/0412 |
| 2019/0163306 | A1* | 5/2019 | Wang | G06F 3/044 |
| 2020/0192543 | A1* | 6/2020 | Wang | G06F 3/04164 |
| 2020/0272279 | A1* | 8/2020 | Wang | H01L 27/3251 |

FOREIGN PATENT DOCUMENTS

WO  WO 2013/063176 A1  5/2013

* cited by examiner

*Primary Examiner* — Amare Mengistu
*Assistant Examiner* — Sarvesh J Nadkarni
(74) *Attorney, Agent, or Firm* — The PL Law Group, PLLC

(57) ABSTRACT

A touch sensor according to an embodiment of the present invention includes a substrate layer, sensing electrodes disposed on the substrate layer, an insulating layer covering the sensing electrodes on the substrate layer, a bridge electrode electrically connecting neighboring sensing electrodes of the sensing electrodes on the insulating layer, and floating electrodes distributed around the bridge electrode on the insulating layer.

13 Claims, 5 Drawing Sheets

TOUCH SENSOR AND IMAGE DISPLAY DEVICE INCLUDING THE SAME

CROSS-REFERENCE TO RELATED APPLICATION AND CLAIM OF PRIORITY

This application claims priority to Korean Patent Applications No. 10-2019-0173848 filed on Dec. 24, 2019 in the Korean Intellectual Property Office (KIPO), the entire disclosure of which is incorporated by reference herein.

BACKGROUND

1. Field

The present invention relates to a touch sensor and an image display device including the same. More particularly, the present invention relates to a touch sensor including a patterned sensing electrode and an image display device including the same.

2. Description of the Related Art

As information technologies are being developed, various demands in display devices having thinner dimension, lightweight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

The touch sensor may be stacked on a display panel, and when sensing electrode of the touch sensor is visually recognized by a user, an image quality of the display device may be deteriorated. Additionally, when the sensing electrodes overlap electrodes and wires of the display panel, a moire pattern may be visually recognized by the user.

Thus, construction of the sensing electrodes having improved optical properties for enhancing the image quality while maintaining desired conductivity and sensitivity for the touch sensing is required.

For example, as disclosed in Korean Patent Application Publication No. 2014-0092366, various image display devices combined with a touch screen panel including a touch sensor has been developed recently. However, the touch sensor or the touch panel having improved compatibility with the image display device is continuously demanded as described above.

SUMMARY

According to an aspect of the present invention, there is provided a touch sensor having improved optical and electrical properties.

According to an aspect of the present invention, there is provided a window stack structure and an image display device including a touch sensor with improved optical and electrical properties.

The above aspects of the present inventive concepts will be achieved by the following features or constructions:

(1) A touch sensor, including: a substrate layer; sensing electrodes disposed on the substrate layer; an insulating layer covering the sensing electrodes on the substrate layer; a bridge electrode electrically connecting neighboring sensing electrodes of the sensing electrodes on the insulating layer; and floating electrodes distributed around the bridge electrode on the insulating layer, the floating electrodes having a waveform or a spatial frequency the same as that of the bridge electrode.

(2) The touch sensor according to the above (1), wherein the sensing electrodes include etched regions therein.

(3) The touch sensor according to the above (2), wherein the etched regions have a curved line shape selected from the group consisting of a sine curve, a cosine curve, a conic section, a catenary, a curve of pursuit, a cycloid, a trochoid and a cardioid.

(4) The touch sensor according to the above (2), wherein the etched regions have a water wave shape extending between vertices of an imaginary polygon.

(5) The touch sensor according to the above (4), wherein the etched regions have a shape in which a water wave corresponding to one period is segmented.

(6) The touch sensor according to the above (2), wherein the floating electrodes are superimposed over the etched regions in a planar view.

(7) The touch sensor according to the above (6), wherein the floating electrodes have the same shape as that of the etched regions.

(8) The touch sensor according to the above (1), wherein the sensing electrodes include first sensing electrodes forming a sensing electrode row; and second sensing electrodes forming a sensing electrode column, and the etched regions include first etched regions formed in the first sensing electrodes and second etched regions formed in the second sensing electrodes.

(9) The touch sensor according to the above (8), wherein the sensing electrode row includes a connecting portion integrally connecting neighboring second sensing electrodes of the second sensing electrodes, and the bridge electrode electrically connects neighboring first sensing electrodes of the first sensing electrodes.

(10) The touch sensor according to the above (9), wherein the bridge electrode is superimposed over a second etched region formed in the connecting portion of the second etched regions in a planar view.

(11) The touch sensor according to the above (8), further including separation regions formed between peripheries of the first sensing electrodes and the second sensing electrodes; and dummy patterns defined by the separation regions.

(12) The touch sensor according to the above (1), wherein the sensing electrodes, the bridge electrode and the floating electrodes include a transparent conductive oxide layer.

(13) The touch sensor according to the above (12), wherein the sensing electrodes, the bridge electrode and the floating electrodes have a multi-layered structure including the transparent conductive oxide layer and a metal layer.

(14) A window stack structure, comprising: a window substrate; and the touch sensor according to embodiments as described above stacked on the window substrate.

(15) An image display device, comprising: a display panel; and the touch sensor according to embodiments as described above stacked on the display panel.

In sensing electrodes of a touch sensor according to exemplary embodiments of the present invention, etched regions having, e.g., a wavy slit shape may be formed. The etched regions may be included, so that a moire phenomenon caused by a regular overlap with pixel structures of a display panel under the touch sensor may be suppressed or reduced. Accordingly, degradation of an image quality of the image display device due to an insertion of the touch sensor may be prevented. Further, a transmittance of the sensing electrodes may be improved by the etched regions, so that the image quality of the image display device may be further improved.

In exemplary embodiments, a floating electrode covering a sensing electrode slit in a planar view may be formed around a bridge electrode. A periphery of the bridge electrode may become a high-frequency environment by the floating electrode, so that a visual recognition of the bridge electrode may be prevented. The floating electrode may overlap the slit, so that the transmittance of the touch sensor may be uniformly maintained while suppressing a generation of parasitic capacitance.

DETAILED DESCRIPTION OF THE EMBODIMENTS

According to exemplary embodiments of the present invention, there is provided a touch sensor that includes sensing electrodes including etched regions therein and a floating electrode, and provides improved optical property. Further, an image display device including the touch sensor and having enhanced image quality is provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, two directions that are parallel to a touch sensor or the same plane (e.g., a top surface of a substrate layer 105) and cross each other are defined as a first direction and a second direction. For example, the first direction and the second direction may be perpendicular to each other.

Figure 1:
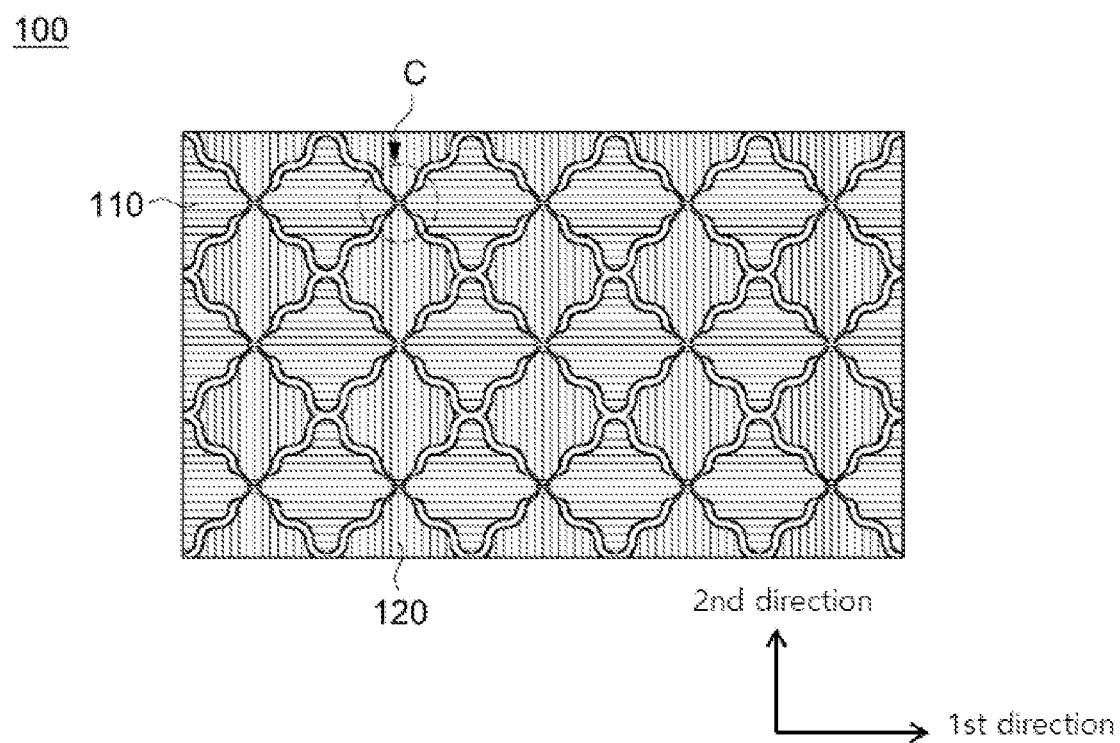
FIGS. 1 and 2 are a schematic top planar view and a schematic cross-sectional view, respectively, illustrating a touch sensor in accordance with exemplary embodiments.
Figure 2:
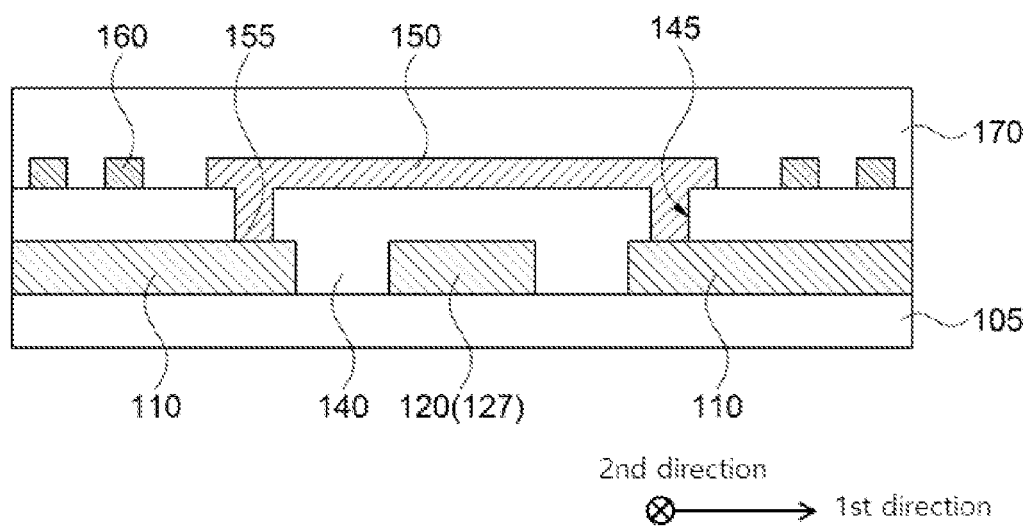

FIGS. 1 and 2 are a schematic top planar view and a schematic cross-sectional view, respectively, illustrating a touch sensor in accordance with exemplary embodiments. Specifically, FIG. 1 provides an example of a touch sensor having a top bridge construction.

FIGS. 1 and 2 are provided to explain an arrangement of sensing electrodes in the touch sensor, and features and scope of the present invention are not defined or limited as illustrated in FIGS. 1 and 2. For convenience of descriptions, illustration of a floating electrode and an etched region formed in the sensing electrodes are omitted in FIG. 1.

Referring to FIGS. 1 and 2, a touch sensor 100 may include the substrate layer 105 and sensing electrodes 110 and 120 arranged on the substrate layer 105.

The substrate layer 105 may include a film-type member used as a base layer for forming the sensing electrodes 110 and 120 or an object on which the sensing electrodes 110 and 120 are formed. In some embodiments, the substrate layer 105 may refer to a display panel on which the sensing electrodes 110 and 120 are directly formed.

For example, the substrate layer 105 may include a substrate or a film material commonly used in a touch sensor. For example, the substrate layer 105 may include glass, polymer and/or an inorganic insulation material. The polymer may include, e.g., cyclo olefin polymer (COP), polyethylene terephthalate (PET), polyacrylate (PAR), polyether imide (PEI), polyethylene naphthalate (PEN), polyphenylene sulfide (PPS), polyallylate (polyallylate), polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. The inorganic insulation material may include, e.g., silicon oxide, silicon nitride, silicon oxynitride, a metal oxide, etc.

In some embodiments, a layer or a film member in an image display device to which the touch sensor is applied may also serve as the substrate layer 105. For example, an encapsulation layer or a passivation layer included in a display panel may serve as the substrate layer 105.

The sensing electrodes 110 and 120 may include first sensing electrodes 110 and second sensing electrodes 120. For example, the sensing electrodes 110 and 120 may be arranged to be operated in a mutual capacitance type.

The first sensing electrodes 110 may be arranged along the first direction (e.g., a row direction or a width direction). Each of the first sensing electrodes 110 may have an independent island pattern shape, and the first sensing electrodes 110 neighboring each other in the first direction may be electrically connected to each other by a bridge electrode 150.

Accordingly, a first sensing electrode row extending in the first direction may be defined, and a plurality of the first sensing electrode rows may be arranged along the second direction.

The second sensing electrodes 120 may be arranged along the second direction. The second sensing electrodes 120 neighboring in the second direction may be connected to each other by a connecting portion 127. The second sensing electrodes 120 and the connecting portion 127 may be integrally connected to each other to be substantially provided as a single member. In this case, the second sensing electrodes 120 and the connecting portion 127 may be formed by patterning the same conductive layer, and may be positioned at the same layer or at the same level.

Accordingly, a second sensing electrode column extending in the second direction may be defined, and a plurality of the second sensing electrode columns may be arranged along the first direction.

As illustrated in FIG. 1, in some embodiments, peripheries of the sensing electrodes 110 and 120 may have a substantially wavy shape. In this case, a moire phenomenon may be more effectively suppressed by a combination with etched regions formed in the sensing electrodes 110 and 120 as described below However, the shape of the peripheries of the sensing electrodes 110 and 120 of FIG. 1 is provided as an exemplary embodiment, and may be properly modified.

As illustrated in FIG. 2, an insulating layer 140 covering the sensing electrodes 110 and 120 may be formed on the substrate layer 105. The bridge electrode 150 may be disposed on the insulating layer 140 to electrically connect the neighboring first sensing electrodes 110 to each other through, e.g., a contact region 145 formed in the insulating layer 140. The bridge electrode 150 may include a contact 155 formed in the contact region 145.

In exemplary embodiments, floating electrodes 160 may be formed around the bridge electrode 150 on the insulating layer 140 to be separated from the bridge electrode 150. Structures and arrangements of the bridge electrode 150 and the floating electrodes 160 will be described later in more detail with reference to FIG. 4.

A passivation layer 170 covering the bridge electrode 150 and the floating electrode 160 may be formed on the insulating layer 140.

The insulating layer 140 and/or the passivation layer 170 may include an inorganic insulating material such as silicon oxide or silicon nitride, or an organic insulating material such as an epoxy-based resin, an acrylic resin, a siloxane-based resin, a polyimide-based resin, etc.

In exemplary embodiments, the sensing electrodes 110 and 120, the bridge electrode 150 and the floating electrode 160 may each include a transparent conductive oxide. For example, the transparent conductive oxide may include indium tin oxide (ITO), indium zinc oxide (IZO), zinc oxide (ZnO), indium zinc tin oxide (IZTO), cadmium tin oxide (CTO), or the like. These may be used alone or in combination of two or more.

In some embodiments, the sensing electrodes 110 and 120, the bridge electrode 150 and the floating electrode 160 may include a metal. For example, the sensing electrodes 110 and 120, the bridge electrode 150 and the floating electrode 160 may include silver (Ag), gold (Au), copper (Cu), aluminum (Al), platinum (Pt), palladium (Pd), chromium (Cr), titanium. (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca), or an alloy containing at least two thereof (e.g., silver-palladium-copper (APC) or copper-calcium (CuCa)).

In some embodiments, the sensing electrodes 110 and 120, the bridge electrode 150 and the floating electrode 160 may include a multi-layered structure including a transparent conductive oxide layer and a metal layer. For example, the sensing electrodes 110 and 120, the bridge electrode 150 and the floating electrode 160 may each have a double-layered structure of a transparent conductive oxide layer-metal layer or a triple-layered structure of a transparent conductive oxide layer-metal layer-transparent conductive oxide layer. In this case, a flexible property may be enhanced by the metal layer and a resistance may be reduced so that a signal transfer speed may be also improved. Further, a resistance to corrosion and a transparency may be enhanced by the transparent conductive oxide layer.

Figure 3:
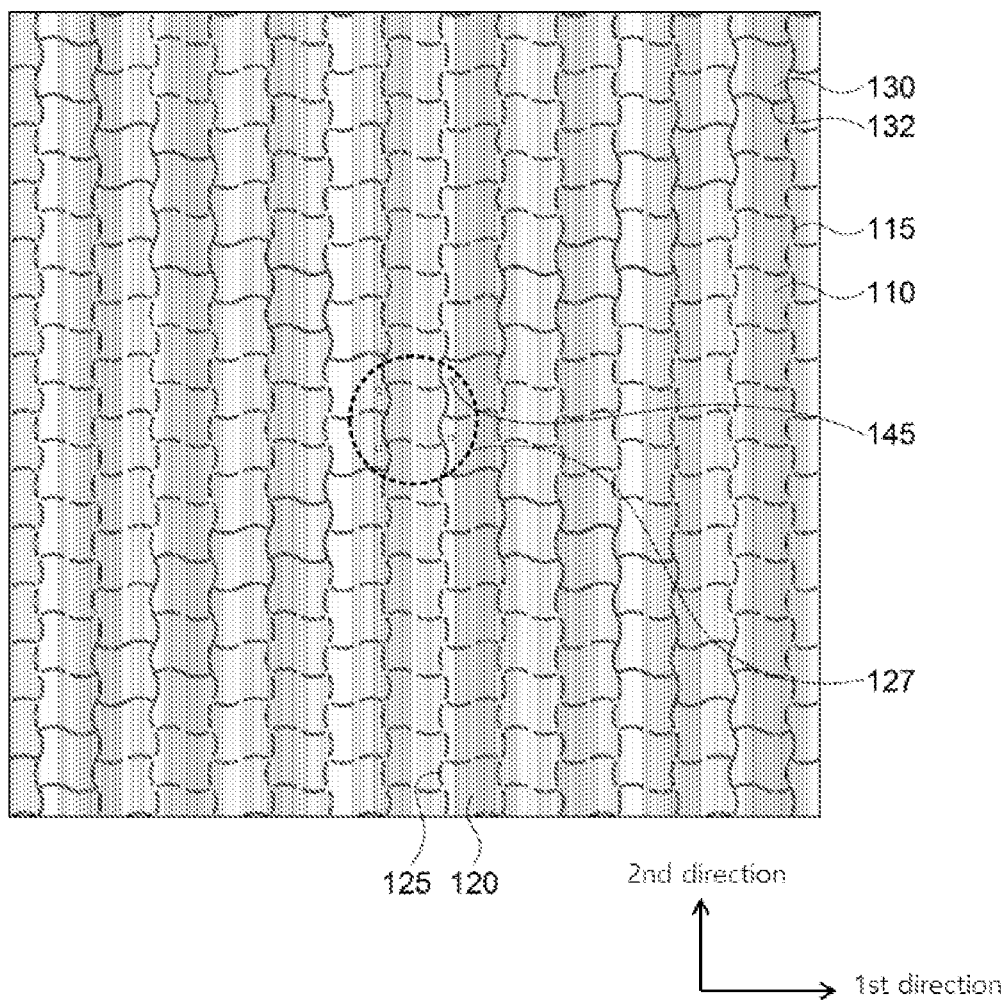
FIG. 3 is a partially enlarged top planar view illustrating a construction of sensing electrodes in a touch sensor in accordance with exemplary embodiments.

FIG. 3 is a partially enlarged top planar view illustrating a construction of sensing electrodes in a touch sensor in accordance with exemplary embodiments. Specifically, FIG. 3 is an enlarged view illustrating a construction of the first sensing electrode and the second sensing electrode around an intersection region C of FIG. 1.

Referring to FIG. 3, as described with reference to FIGS. 1 and 2, the touch sensor may include the first sensing electrodes 110 and the second sensing electrodes 120. The second sensing electrodes 120 may be integrally connected to each other via the connecting portion 127 along the second direction. The first sensing electrodes 110 may be arranged to be spaced apart from each other in the first direction.

According to example embodiments, etched regions 115 and 125 may be formed at insides of the sensing electrodes 110 and 120. First etched regions 115 may be formed at an inside of the first sensing electrode 110, and second etching regions 125 may be formed at an inside of the second sensing electrode 120.

The term "etched region" used in the present application may refer to a region or a space that is removed by etching an inside of a conductive layer or a conductive pattern in a predetermined shape. In exemplary embodiments, the etched region may have a shape such as a slit, a hole or an opening.

In some embodiments, the etched regions 115 and 125 may be formed as slits having a curved line shape. The curved line shape of the etched regions 115 and 125 may include a sine curve, a cosine curve, a conic section, a catenary, a curve of pursuit, a cycloid, a trochoid, a cardioid, or the like.

The etched regions 115 and 125 may be regularly and repeatedly arranged. For example, the etched regions 115 and 125 may be arranged along sides of an imaginary rectangle (e.g., an imaginary square).

As illustrated in FIG. 3, the etched regions 115 and 125 may have a shape in which a water wave corresponding to one period is segmented between vertices of the imaginary square. In an embodiment, the imaginary squares may be arranged in a zigzag shape so that the vertices may be offset or staggered.

Dummy patterns 130 may be formed between the first sensing electrode 110 and the second sensing electrode 120 neighboring each other. The dummy pattern 130 may be defined by a separation region 132 extending along peripheries of the first sensing electrode 110 and the second sensing electrode 120. The separation region 132 may have a waveform substantially the same as or similar to that of the first and second etched regions 115 and 125. Accordingly, the dummy pattern 130 may have a shape substantially the same as or similar to a shape of a conductive pattern at the inside of the sensing electrodes 110 and 120 (e.g., a quadrangle having four sides that are transformed into a water wave).

Accordingly, uniformity of an electrode structure in the touch sensor may be improved, so that an electrode visual recognition due to a local deviation of a pattern shape may be prevented.

The contact regions 145 that may be in contact with or connected with the bridge electrode 150 may be allocated on portions of the first electrodes adjacent to the connecting portion 127.

According to the above-described exemplary embodiments, the etched regions 115 and 125 may be formed at the inside of each of the sensing electrodes 110 and 120. Accordingly, a moire phenomenon caused by a regular overlap of the sensing electrodes 110 and 120 with a pixel structure included in a display panel may be prevented or reduced. For example, a spatial frequency generated by an overlap between the sensing electrodes 110 and 120 and the pixel structure may be suppressed or canceled by the etched regions 115 and 125.

Further, the etched regions 115 and 125 may serve as light slits, so that the moire phenomenon may be more effectively suppressed by a light diffraction or scattering, and the sensing electrodes 110 and 120 may be prevented from being visually recognized by the user.

Figure 4:
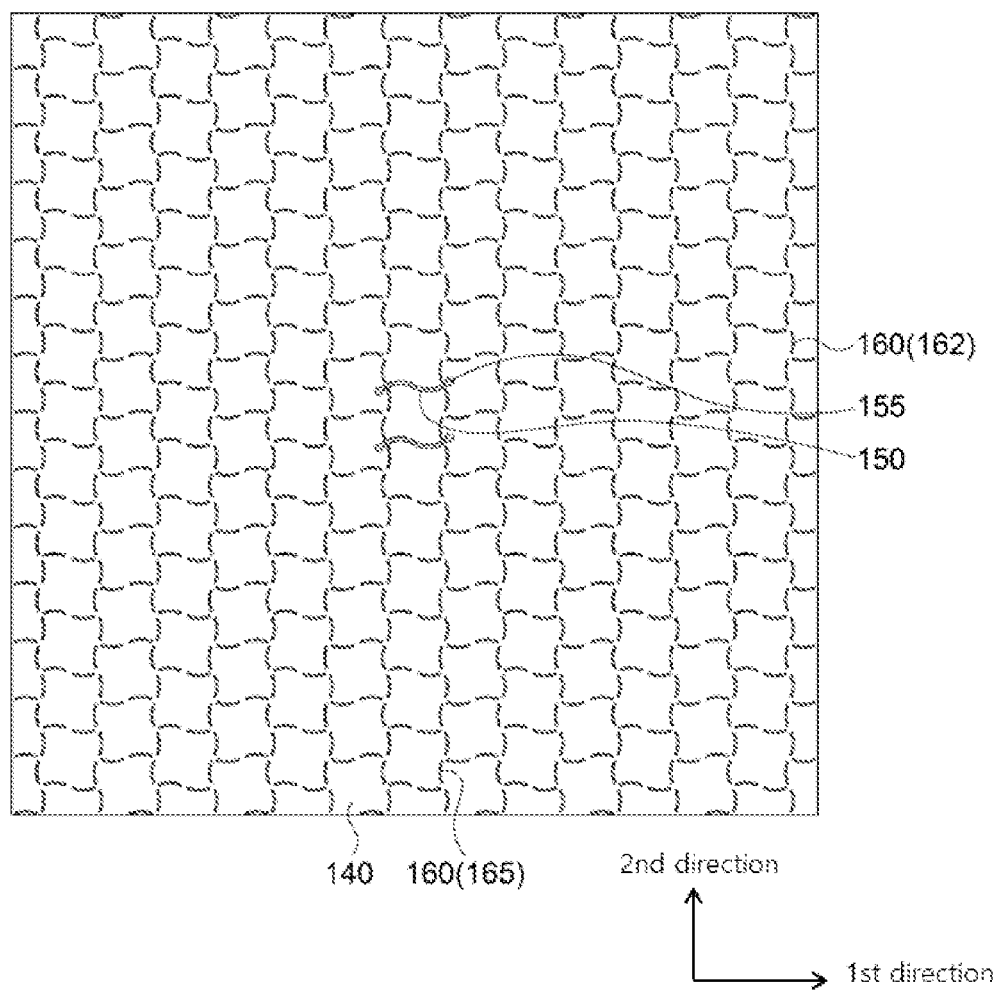
FIG. 4 is a partially enlarged top planar view illustrating a construction of a bridge electrode and a floating electrode in a touch sensor in accordance with exemplary embodiments.

FIG. 4 is a partially enlarged top planar view illustrating a construction of a bridge electrode and a floating electrode in a touch sensor in accordance with exemplary embodiments.

As described above, the insulating layer 140 covering the first and second sensing electrodes 110 and 120 described with reference to FIG. 3 may be formed, and the bridge electrode 150 and the floating electrodes 160 may be formed on the insulating layer 140.

The contact 155 of the bridge electrode 150 may be formed in the contact region 145 as illustrated in FIG. 3, so that neighboring first sensing electrodes 110 may be electrically connected to each other.

The bridge electrode 150 may have a substantially wavy shape. The bridge electrode 150 may have a waveform substantially the same as or similar to that of the etched region extending in the first direction among the etched regions 115 and 125 as described with reference to FIG. 3.

The floating electrodes 160 may be repeatedly and regularly arranged around the bridge electrode 150. The floating electrodes 160 may have an arrangement and a shape substantially the same as those of the etched regions 115 and 125 formed in the first and second sensing electrodes 110 and 120.

In exemplary embodiments, the floating electrodes 160 may be arranged to be superimposed over the etched regions 115 and 125 in a planar view. For example, the floating electrodes 160 may be arranged to completely coincide with the etched regions 115 and 125 in the planar view.

The floating electrodes 160 may include first floating electrodes 162 covering the first etched regions 115 included in the first sensing electrode 110 and second floating electrodes 165 covering the second etched regions 125 included in the second sensing electrode 120 in the planar view.

In exemplary embodiments, the floating electrodes 160 may have a waveform substantially the same as that of the bridge electrode 150 or may be arranged along the same profile as that of the bridge electrode 150.

Additionally, the floating electrodes 160 may be arranged to have the same spatial frequency as that of the bridge electrode 150. For example, a profile by which the floating electrodes 160 are arranged may have a period and a frequency substantially the same as those of the bridge electrode 150. For example, as illustrated in FIG. 4, a distance or a pitch between two adjacent bridge electrodes 150 may be substantially the same as a distance or a pitch between the floating electrodes 160 facing in the second direction.

As described above, the floating electrodes 160 having substantially the same waveform as that of the bridge electrode 150 may be distributed on the insulating layer 140, so that an optical environment around the bridge electrode 150 may be shifted into a high-frequency spatial frequency environment that may not be observed by the user. Accordingly, a visibility of the bridge electrode 150 may be substantially suppressed or reduced.

The floating electrodes 160 may be superimposed over the etched regions 115 and 125 with the insulating layer 140 interposed therebetween. Accordingly, a generation of a parasitic capacitance due to an addition of the floating electrode 160 may be suppressed. Additionally, the floating electrode 160 may be disposed on the etched regions 115 and 125, so that transmittance may become uniform throughout the touch sensor.

In some embodiments, the bridge electrode 150 may also be superimposed over the second etching region 125 included in the connecting portion 127 as illustrated in FIG. 3 in a planar view. Accordingly, the generation of the parasitic capacitance due to an overlap of electrodes may be suppressed, and the uniform transmittance may be implemented.

Figure 5:
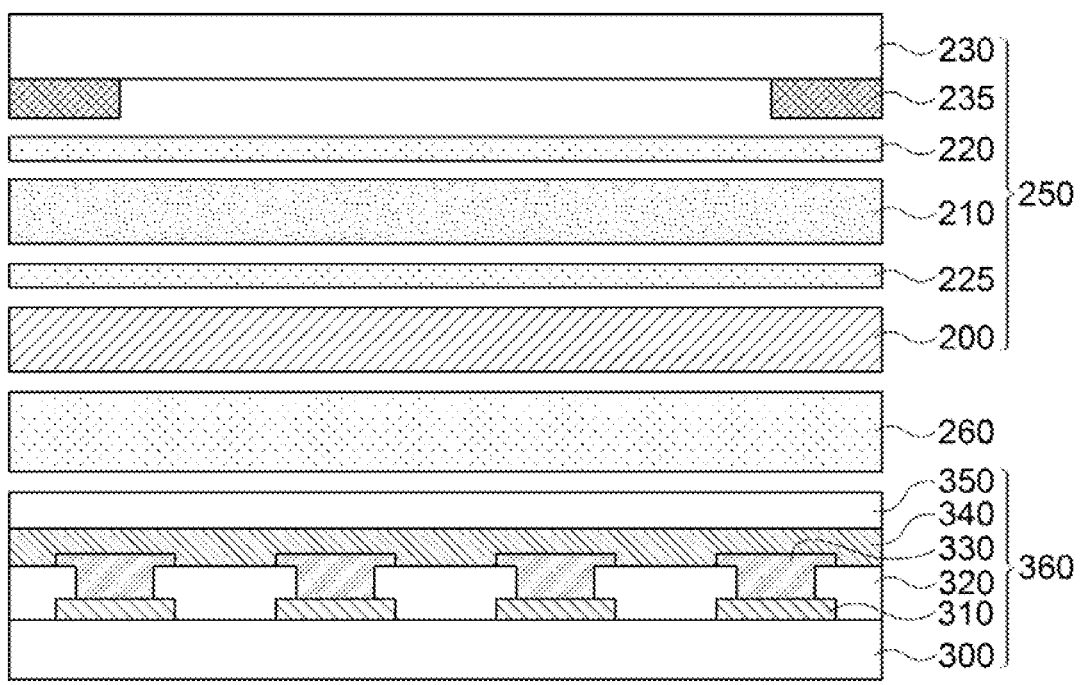
FIG. 5 is a schematic cross-sectional view illustrating a window stack structure and an image display device in accordance with exemplary embodiments.

FIG. 5 is a schematic cross-sectional view illustrating a window stack structure and an image display device in accordance with exemplary embodiments.

Referring to FIG. 5, a window stack structure 250 may include a window substrate 230, a polarizing layer 210 and a touch sensor 200 according to exemplary embodiments as described above.

The window substrate 230 may include, e.g., a hard coating film. In an embodiment, a light-shielding pattern 235 may be formed on a peripheral portion of a surface of the window substrate 230. The light-shielding pattern 235 may include a color-printed pattern, and may have a single-layered or multi-layered structure. A bezel portion or a non-display region of the image display device may be defined by the light-shielding pattern 235.

The polarizing layer 210 may include a coating-type polarizer or a polarizing plate. The coating-type polarizer may include a liquid crystal coating layer that may include a cross-linkable liquid crystal compound and a dichroic dye. In this case, the polarizing layer 210 may include an alignment layer for providing an orientation of the liquid crystal coating layer.

For example, the polarizing plate may include a polyvinyl alcohol-based polarizer and a protective film attached to at least one surface of the polyvinyl alcohol-based polarizer.

The polarizing layer 210 may be directly attached to the surface of the window substrate 230 or may be attached via a first adhesive layer 220.

The touch sensor 200 may be included in the window stack structure 250 as a film or a panel. In an embodiment, the touch sensor 200 may be combined with the polarizing layer 210 via a second adhesive layer 225.

As illustrated in FIG. 5, the window substrate 230, the polarizing layer 210 and the touch sensor 200 may be sequentially positioned from a viewer's side. In this case, the sensing electrodes of the touch sensor 200 may be disposed under the polarizing layer 210 so that electrode patterns may be effectively prevented from being recognized by the viewer.

If the touch sensor 200 includes a substrate, the substrate may include, e.g., triacetyl cellulose, cycloolefin, cycloolefin copolymer, polynorbornene copolymer, or the like, and preferably, may have an in-plane retardation value of ±2.5 nm or less.

In an embodiment, the touch sensor 200 may be directly transferred to the window substrate 230 or the polarizing layer 210. In an embodiment, the window substrate 230, the touch sensor 200 and the polarizing layer 210 may be sequentially positioned from the viewer's side.

The image display device may include a display panel 360 and the window stack structure 250 disposed on the display panel 360.

The display panel 360 may include a pixel electrode 310, a pixel defining layer 320, a display layer 330, an opposing electrode 340 and an encapsulation layer 350 disposed on a panel substrate 300.

A pixel circuit including a thin film transistor (TFT) may be formed on the panel substrate 300, and insulation layer covering the pixel circuit may be formed. The pixel electrode 310 may be electrically connected to, e.g., a drain electrode of the TFT on the insulation layer.

The pixel defining layer 320 may be formed on the insulation layer, and the pixel electrode 310 may be exposed through the pixel defining layer 320 such that a pixel region may be defined. The display layer 330 may be formed on the pixel electrode 310, and the display layer 330 may include, e.g., a liquid crystal layer or an organic light emitting layer.

The opposing electrode 340 may be disposed on the pixel defining layer 320 and the display layer 330. The opposing electrode 340 may serve as, e.g., a common electrode or a cathode of the image display device. The encapsulation layer 350 may be disposed on the opposing electrode 340 to protect the display panel 360.

In some embodiments, the display panel 360 and the window stack structure 250 may be combined with each other through an adhesive layer 260. For example, a thickness of the adhesive layer 260 may be greater than each thickness of the first adhesive layer 220 and the second adhesive layer 225. A viscoelasticity of the adhesive layer 260 may be about 0.2 MPa or less at a temperature ranging from −20° C. to 80° C. In this case, a noise from the display panel 360 may be blocked, and an interface stress while being bent may be alleviated so that damages of the window stack structure 250 may be avoided. In an embodiment, the viscoelasticity of the adhesive layer 260 may be in a range from about 0.01 MPa to about 0.15 MPa.

The touch sensor 200 may include the etched regions and the floating electrodes according to exemplary embodiments as described above, so that improved touch sensitivity may be implemented while preventing a degradation of an image quality from the display panel 360.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A touch sensor, comprising:
    a substrate layer;
    sensing electrodes disposed on the substrate layer and spaced apart from each other by separation regions formed between peripheries of the sensing electrodes;
    an insulating layer covering the sensing electrodes on the substrate layer;
    a bridge electrode electrically connecting neighboring sensing electrodes of the sensing electrodes on the insulating layer; and
    floating electrodes distributed around the bridge electrode on the insulating layer, the floating electrodes having a waveform or a spatial frequency the same as that of the bridge electrode,
    wherein the sensing electrodes include etched regions therein, and the floating electrodes are disposed at a different level from that of the sensing electrodes to be superimposed over the etched regions in a planar view.

2. The touch sensor of claim 1, wherein the etched regions have a curved line shape selected from the group consisting of a sine curve, a cosine curve, a conic section, a catenary, a curve of pursuit, a cycloid, a trochoid and a cardioid.

3. The touch sensor of claim 1, wherein the etched regions have a water wave shape extending between vertices of an imaginary polygon.

4. The touch sensor of claim 3, wherein the etched regions have a shape in which a water wave corresponding to one period is segmented.

5. The touch sensor of claim 1, wherein the floating electrodes have the same shape as that of the etched regions.

6. The touch sensor of claim 1, wherein the sensing electrodes comprise first sensing electrodes forming a sensing electrode row; and second sensing electrodes forming a sensing electrode column; and
    the etched regions comprise first etched regions formed in the first sensing electrodes and second etched regions formed in the second sensing electrodes.

7. The touch sensor of claim 6, wherein the sensing electrode row comprises a connecting portion integrally connecting neighboring second sensing electrodes of the second sensing electrodes; and
    the bridge electrode electrically connects neighboring first sensing electrodes of the first sensing electrodes.

8. The touch sensor of claim 7, wherein the bridge electrode is superimposed over a second etched region formed in the connecting portion of the second etched regions in a planar view.

9. The touch sensor of claim 6, further comprising separation regions formed between peripheries of the first sensing electrodes and the second sensing electrodes; and
    dummy patterns defined by the separation regions.

10. The touch sensor of claim 1, wherein the sensing electrodes, the bridge electrode and the floating electrodes include a transparent conductive oxide layer.

11. The touch sensor of claim 10, wherein the sensing electrodes, the bridge electrode and the floating electrodes have a multi-layered structure comprising the transparent conductive oxide layer and a metal layer.

12. A window stack structure, comprising:
    a window substrate; and
    the touch sensor of claim 1 stacked on the window substrate.

13. An image display device, comprising:
    a display panel; and
    the touch sensor of claim 1 stacked on the display panel.

* * * * *